(12) United States Patent
Takekawa

(10) Patent No.: US 8,555,213 B1
(45) Date of Patent: Oct. 8, 2013

(54) EFFICIENT DECOMPOSITION OF LAYOUTS

(75) Inventor: Yoko Takekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/422,122

(22) Filed: Mar. 16, 2012

(51) Int. Cl.
*G06F 17/50* (2006.01)

(52) U.S. Cl.
USPC .......................................................... 716/54

(58) Field of Classification Search
USPC .................................................. 716/100, 54
See application file for complete search history.

(56) References Cited

U.S. PATENT DOCUMENTS

| | | | |
|---|---|---|---|
| 8,429,582 B1 * | 4/2013 | Lai et al. | 716/112 |
| 2006/0190850 A1 * | 8/2006 | Kohle et al. | 716/2 |
| 2009/0187590 A1 | 7/2009 | Maeda et al. | |
| 2012/0180006 A1 * | 7/2012 | Baum et al. | 716/52 |

FOREIGN PATENT DOCUMENTS

| | | |
|---|---|---|
| JP | 2001-133962 | 5/2001 |
| JP | 2007-080965 | 3/2007 |
| JP | 2008-064820 | 3/2008 |

* cited by examiner

*Primary Examiner* — Suchin Parihar
(74) *Attorney, Agent, or Firm* — White & Case LLP

(57) ABSTRACT

Described herein are methods and systems for efficiently preparing a wafer layout for processing into a photomask. Portions of layouts containing semiconductor features and designs that are frequently used can be stored in a database. These portions can be post-decomposition, with all treatment and error checking already performed upon them. When a wafer layout is received for processing into a photomask, the processing and decomposition time can be reduced by analyzing the layout, and replacing sections of the layout with the portions from the database that have already been decomposed and processed. As these sections no longer need to be decomposed, error checked, and treated, the processing time is greatly reduced, and photomasks can be made quicker and more efficiently.

20 Claims, 6 Drawing Sheets

EFFICIENT DECOMPOSITION OF LAYOUTS

FIELD

Embodiments described herein generally relate to systems and methods for preparation of mask data and decomposition of layouts in a semiconductor design and manufacturing environment.

BACKGROUND

Manufacturing increasingly advanced semiconductors requires that the minimum size of the features on the chips decrease every generation. As the critical feature sizes on semiconductors start to shrink beyond the minimum wavelength of the light (193 nm-248 nm), a variety of techniques such as larger lenses and multi-patterning can be used to make sub-wavelength features. One promising class of techniques, pitch splitting processes, in particular Sidewall Image Transfer (SIT), are among the best candidates for 20 nm and beyond technology, where conventional single exposure lithography will not work.

These pitch splitting processes use multiple lithography steps in order to produce the semiconductors. To simplify and minimize the complexity of the design, the chip designers can draw final wafer images as a single layer and those layouts can be decomposed into several different layers and patterns during the mask data preparation. Decomposing layouts is a calculation intensive process, and massive amounts of processing time are required in order to decompose the design layout into the photomask layers.

The above-described deficiencies of decomposing layouts for preparing photomasks are merely intended to provide an overview of some problems of current technology, and are not intended to be exhaustive. Other problems with the state of the art, and corresponding benefits of some of the various non-limiting embodiments described herein, may become further apparent upon review of the following detailed description.

DETAILED DESCRIPTION

Figure 1:
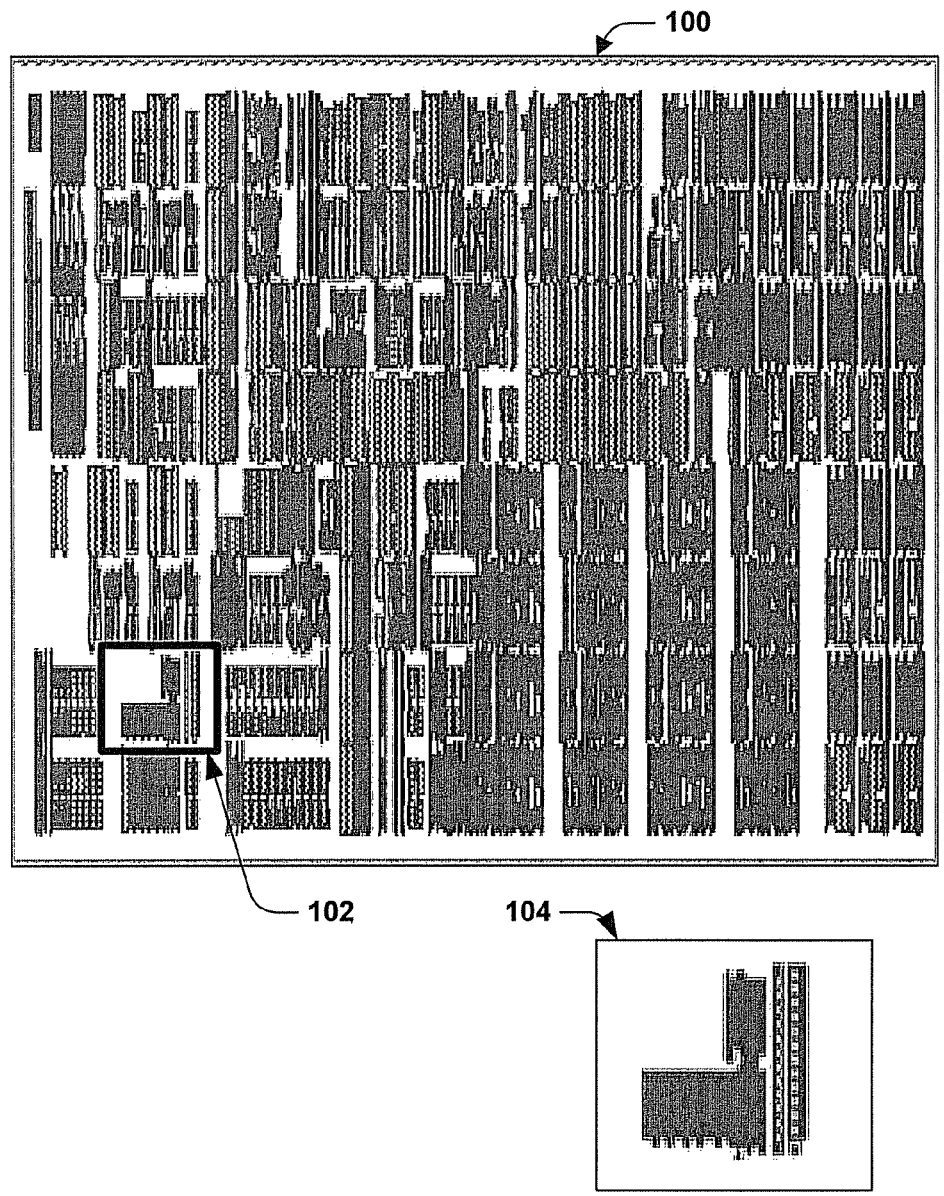
FIG. 1 illustrates a representative schematic of a wafer layout with portions of layouts that match sections of the wafer layout in accordance with an embodiment of the subject disclosure.

The subject disclosure described herein provides an efficient system and method for preparing photomasks from layouts. Wafer schematics and images can be drawn on a single layer in order to simplify the design process for the designers. To create semiconductors at 20 nm and beyond however, these layouts must be decomposed into multiple photomasks to successfully create features that are smaller than the wavelength of the light being used. Pitch splitting processes such as SIT can be used to achieve 20 nm and smaller technology nodes where single exposure lithography becomes inoperable. The photomasks used in SIT must therefore be decomposed from the single layer design layouts.

To make the decomposition process more efficient, a library of pre-decomposed layouts can be stored in a database. This database can store portions of layouts with commonly used features and when it is determined that the single layer layout matches the portions with decomposed features, those sections of the layout can be removed, and replaced with the already decomposed portions. This reduces the amount of the layout that needs to be decomposed, speeding up the photomask preparation process.

Layout treatments such as mask data preparation and optical proximity correction can be applied to the pre-decomposed layouts stored in the library prior to this process, which reduces the processing and CPU costs even further. Design rule check, sidewall image check, litho margin check, and optical rule check can also be applied before replacing the sections of the layout with the portions of pre-decomposed layouts. By applying these checks in advance and collecting error free layouts in a library, not only will the mask data preparation time be reduced, but also the verification process time will be reduced, improving the mask quality.

Additionally, to avoid discontinuities along the clipped boundary, patterns around the boundary lines can be excised to enable a clean fit. The excised patterns can be decomposed themselves into a separate photomask. Creating a separate photomask to overlay the boundary area allows for fine-tuning the placement to avoid boundary errors.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices can be shown in block diagram form in order to facilitate describing the claimed subject matter.

Referring now to FIG. 1, a representative schematic of a wafer layout with portions of layouts that match sections of the wafer layout in accordance with an embodiment of the subject disclosure is shown. Wafer layout 100 is shown with a section of layout 102 that matches a portion of a layout 104 stored in a database.

Wafer layout 100 can be a single layer layout designed by the chip architects that can be decomposed into the multiple layers used to create the photomasks. Wafer layout 100 can represent what the semiconductor will look like once it is printed, and after the decomposition and lithography steps take place.

Wafer layout 100 can contain numerous features that together make up the semiconductor. These features can be divided into sections that can be variable in size and shape. There can be any combination of sections possible, depending on the semiconductor being printed. One such exemplary section, section 102, can have a corresponding layout portion 104 that is stored in a database. Layout portion 104 can be pre-decomposed into two or more layers, and can match what section 102 would look like when wafer layout 100 is decomposed.

It is to be appreciated that while FIG. 1 shows that wafer layout 100 has one matching section and portion, there can be any number of matching pairs. In fact a database can store enough portions of pre-decomposed layouts such that all or nearly all of an entire wafer layout can be reconstructed using the portions saved in the database. As more sections of the wafer layout 100 are replaced with pre-decomposed portions, less CPU time is required to decompose wafer layout 100 into the multiple layers needed to construct the photomasks.

The portions can also be of any size in relation to the wafer layouts. In FIG. 1, portion 104 is small relative to wafer layout 100, but the database can store portions that are much larger or smaller than that portrayed in FIG. 1. It is possible that the library can have a portion that matches a section of the wafer layout such that the portion forms a majority of the area of the wafer layout. This can happen at any time, but particularly when only small changes are made in the designs of new semiconductors, and the wafer layouts are lightly modified versions of previous semiconductors.

Figure 2:
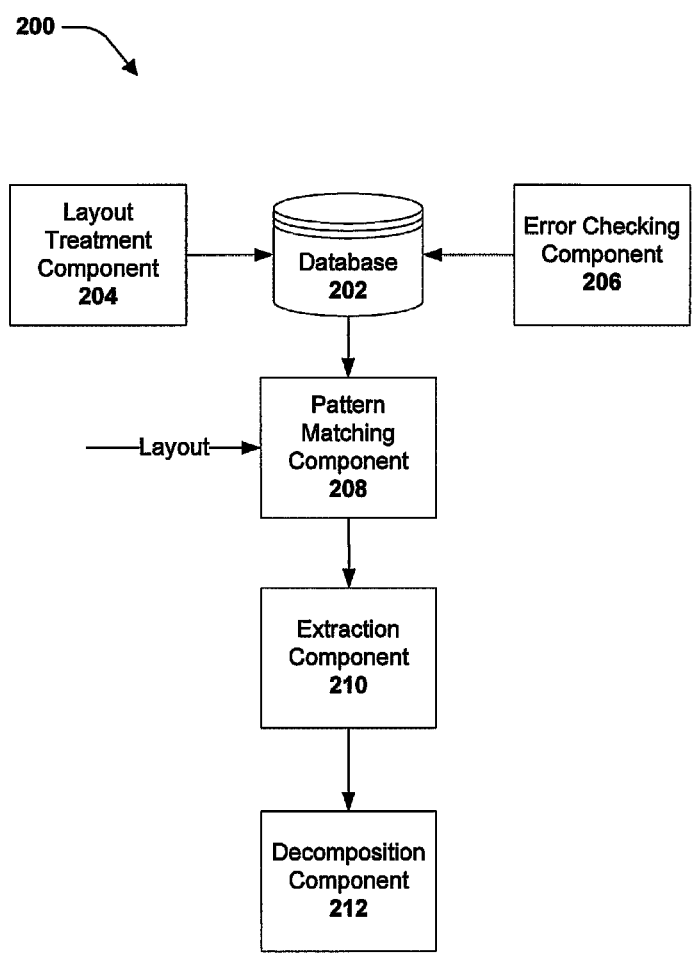
FIG. 2 illustrates a system for decomposing a layout in accordance with an embodiment of the subject disclosure.

Turning now to FIG. 2, a system 200 for decomposing a layout in accordance with an embodiment of the subject disclosure is shown. System 200 includes database 202 that stores portions of layouts in a library, layout treatment component 204 and error checking component 206 that can perform a variety of treatments and checks on portions of decomposed layouts stored in the database to get them ready for being used in the photomask. Pattern matching component 208 can be provided to receive a wafer layout and then determine which portions, if any that are stored in the database match section of the wafer layout. Extraction component 210 can then be provided to remove those sections of the layout that match the portions, and lastly decomposition component 212 can be provided to decompose the areas of the layout that remain after the sections have been removed.

Database 202 can contain portions of layouts that can be commonly used patterns and designs that can be preloaded into the database. The portions can also be automatically saved in response to a determination that a particular feature has been used a certain number of times. For instance, if pattern matching component 208 determines that a section on a wafer layout has been used frequently but is not stored in the database, the pattern matching component 208 can recommend that the portion be stored in the database, or can upload the portion directly. Once the section has been saved, it can be decomposed, and the decomposed layers can be saved in an appropriate library.

In some embodiments, database 202 can contain multiple libraries, where each library can contain portions of layouts that are related to each other. Separating the portions into separate libraries based on function or origin can make it easier to find the portions when trying to match them to the wafer layout. In other embodiments, all of the portions can be stored in a single library.

Layout treatment component 204 can perform treatment on the portions of layouts as they are being stored or after they are already stored in the database 202. Layout treatments can include such treatments as mask data preparation and optical proximity correction. Mask data preparation translates an intended set of polygons on the wafer layout into a form that can be physically written by the photomask writer. Usually this involves fracturing complex polygons into simpler shapes, often rectangles and trapezoids that can be written by the mask writing hardware. Optical proximity correction is an enhancement technique that compensates for image errors due to diffraction or process effects. These treatments can be applied to the portions once they have been decomposed and prior to processing into the photomask. Such treatments enable the resulting photomasks to be more accurate.

Error checking component 206 can check for errors in the decomposed layers as well. Such error checks can include design rule check, litho margin check, and optical rule check. Design rule check can determine whether the particular chip layout satisfies a series of recommended parameters. Optical rule check can be performed after optical proximity checking and identifies hotspots caused by process proximity effects. Performing these checks and treatments on the decomposed portions prior to replacing the sections of the wafer layout can save valuable processing time and increase the efficiency of the lithography system.

Pattern matching component 208 can be provided to receive a wafer layout and then determine which portions, if any, stored in the database 202 match sections of the wafer layout. Pattern matching component 209 can analyze the received wafer layout and then search through the database 202 to find a matching portion.

In an embodiment, pattern matching component 208 can use pattern matching algorithms to determine whether portions stored in the database 202 are the equivalent features on the wafer layout. Since the received wafer layout can be received without having been decomposed into the multiple layers and the portions stored in database 202 can be decomposed, in some embodiments pattern matching component can virtualize the decomposition of the wafer layout to more accurately determine whether stored portions match sections of the layout.

In other embodiments, pattern matching component 208 can analyze metadata associated with the wafer layout and the portions stored in the database 202 to determine whether the portions can replace sections of the wafer layout. The portions can be tagged with information that describes the portion. The information can be a physical or functional description of the portion, or the information can be information that identifies the portion, or the features on the portion. The wafer layout can also have metadata associated with it that identifies the different sections, and describes the layout. The pattern matching component 208 can then match together the metadata or the tags to find matching portions.

Once pattern matching component 208 determines that there are stored portions of layouts in the database 202 that match the sections of the wafer layout, extraction component 210 can be configured to remove those sections of the layout that match the portions. Extracting the portions before the decomposition process reduces the amount of wafer layout that needs to be decomposed, saving computing time, and speeding up the photomask preparation process.

In an embodiment, extraction component 210 can remove a strip of the wafer layout that bounds the area around the section that is to be replaced. Removing only the section that is to be replaced, and overlaying the portion directly over the selection can result in minor boundary errors such as discontinuities along the clipped boundary. Extracting a strip of the layout around the section and placing the portion in the empty space (described in more detail in FIG. 4) can reduce these errors.

When the sections have been extracted, decomposition component 212 can be configured to decompose the layout into the multiple layers that will be used to create the photomask. Since sections have been removed from the layout, the decomposition process will be faster than it would have been without sections removed.

Figure 3:
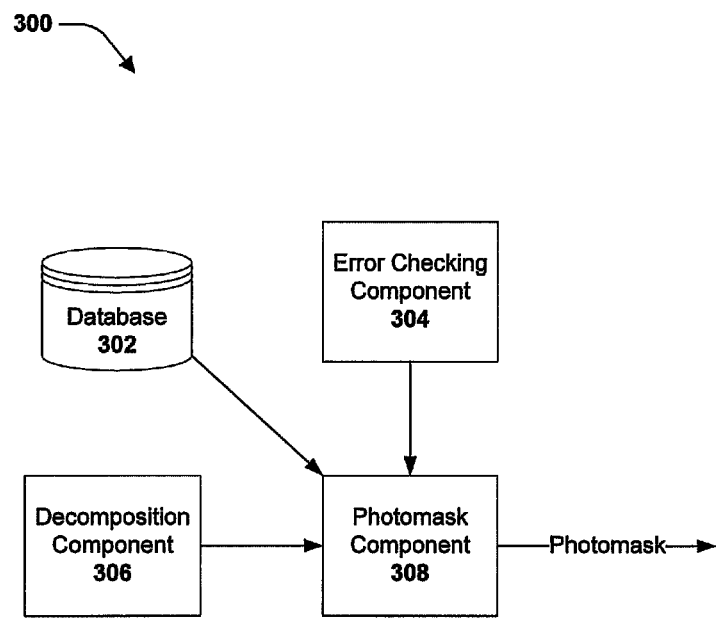
FIG. 3 illustrates a system for preparing a photomask using layout portions stored in a database in accordance with an embodiment of the subject disclosure.

Turning now to FIG. 3, a system 300 for preparing a photomask using layout portions stored in a database in accordance with an embodiment of the subject disclosure is shown. Database 302 can be provided to store portions of layouts and photomask component 308 can be provided to receive the decomposed wafer layout from decomposition component 306 and the database 302, and photomask component 308 can also create a set of photomasks using the decomposed wafer layout and the portions. Error checking component 304 can check for errors on the decomposed wafer layout and the photomasks.

Photomask component 308 can receive the decomposed wafer layouts from the decomposition component 306. The decomposed wafer layouts are missing the sections that were removed by the extraction component 210. Photomask component 308 can also receive the matching portions of layouts that were indicated to have matched the wafer layout from the database 302. Once portions have been received, photomask component 308 can overlay the portions over the extracted sections in the correct orientation and position to complete the wafer layout in order to create a set of photomasks based on the layout.

In some embodiments, the photomask can have gaps between the portions that were added in and the rest of the layout. These gaps are the result of the boundary removal by the extraction component 210. In this embodiment, the decomposition component 306 can decompose those boundary areas and forward them to photomask component 308 that can create separate photomasks for the boundary areas. Overlaying these photomasks over the gaps on the wafer layout photomasks can allow for fine-tuning of the positioning, reducing the boundary errors.

Figure 4:
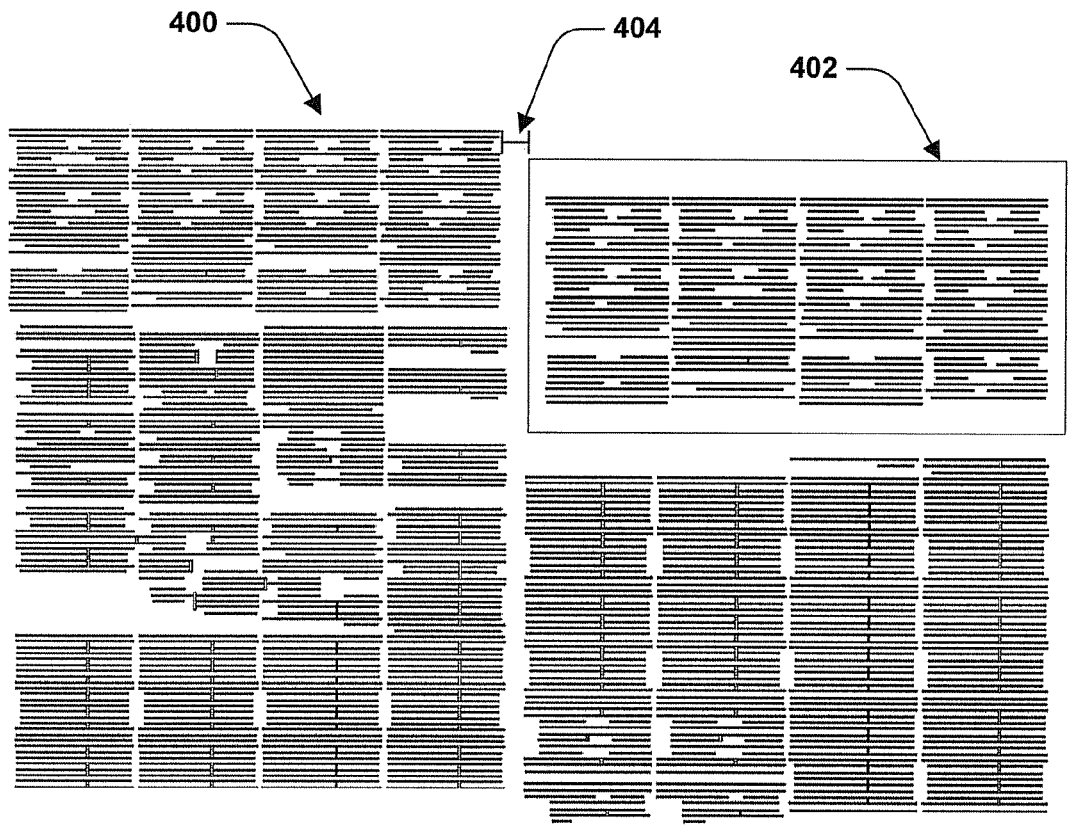
FIG. 4 illustrates a representative schematic of a wafer layout with a boundary area removed around the inserted layout portion in accordance with an embodiment of the subject disclosure.

Turning now to FIG. 4, a representative schematic of a wafer layout with a boundary area removed around the inserted layout portion in accordance with an embodiment of the subject disclosure is shown. The wafer layout 400 can be a representation of the post-decomposition layout with an extracted section. Portion 402 can replace the section that was extracted from layout 400. A boundary area 404 around the extracted area can also be removed to limit defects cause by overlapping and mismatched layout patterns. The removed boundary area 404 can be filled in afterwards with a separate photomask that has been checked for errors.

Figure 5:
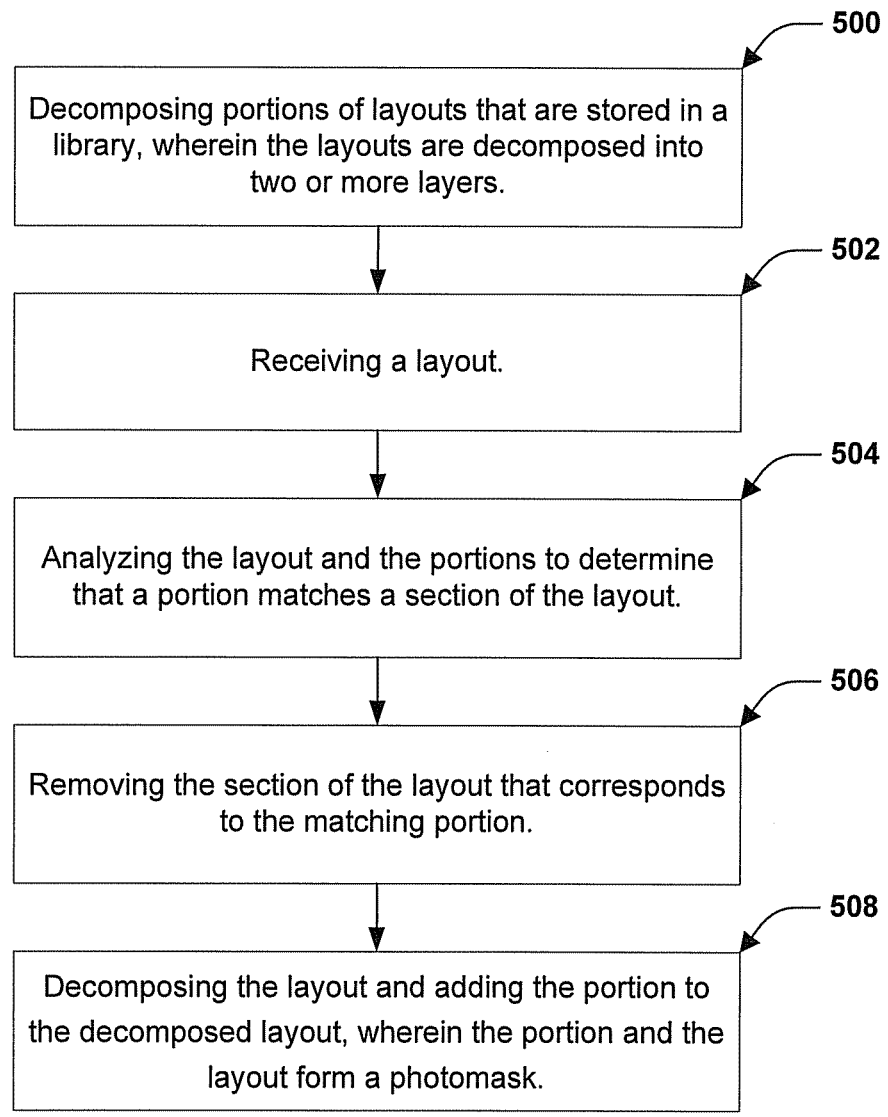
FIG. 5 illustrates a flowchart diagram for preparing a photomask using a layout and portions of pre-decomposed layouts stored in a database in accordance with an embodiment of the subject disclosure.

FIG. 5 illustrates a process in connection with systems 200 and 300 of FIGS. 2 and 3. The process of FIG. 5 can be implemented for example by systems 200-300. Turning now to FIG. 5, a flowchart diagram for preparing a photomask using a layout and portions of pre-decomposed layouts stored in a database in accordance with an embodiment of the subject disclosure is shown.

At 500, portions of layouts that are stored in a library can be decomposed, wherein the layouts are decomposed into two or more layers. The portions of layouts that have been stored in the library can be treated and error checked such that they are ready for SIT. The portions can have treatments such as mask data preparation and optical proximity correction already performed on the portions. The portions can also have been error checked using such error checking procedures as design rule check, sidewall image check, litho margin check, and optical rule check. The portions can already have been subjected to split processing such as decomposition, to get them ready for substitution during the photomask creation.

At 502, a wafer layout can be received. The wafer layout can be a single layer layout designed by the chip architects that can be decomposed into the multiple layers used to create the photomasks. The wafer layout can represent what the semiconductor will look like once it is printed after the decomposition and lithography steps are completed.

At 504, the received layout and the portions stored in the database can be analyzed to determine whether a portion matches a section of the layout. Pattern matching algorithms can be used to determine whether portions stored in the database are equivalent to features on the wafer layout. Since the received wafer layout can be received without having been decomposed into the multiple layers and the portions stored in database can already be decomposed, in some embodiments the wafer layout can be virtually decomposed to determine what the layers would look like once decomposed to assist the pattern matching algorithms.

In other embodiments metadata associated with the wafer layout and the portions stored in the database can be analyzed to determine whether the portions can replace sections of the wafer layout. The portions can be tagged with information that describes the portion. The information can be a physical or functional description of the portion, or the information can be information that identifies the portion, or the features on the portion. The wafer layout can also have metadata associated with it that identifies the different sections, and describes the layout. Matching portions can then be found based on whether the metadata of the portions corresponds to the wafer layout metadata.

At 506, the sections of the layout that correspond to the matching portions can be removed. Extracting the portions before the decomposition process reduces the amount of wafer layout that needs to be decomposed, saving computing time, and speeding up the photomask preparation process. A boundary area around the section to be removed can also be extracted. Removing only the section that is to be replaced, and overlaying the portion directly over the selection can result in minor boundary errors such as discontinuities along the clipped boundary. Extracting a strip of the layout around the section and placing the portion in the empty space can reduce these errors.

At 508, the layout is decomposed, and the portion is added to the decomposed layout, wherein the portion and the layout are together are used to create a photomask. The wafer layout decomposed into the multiple layers that will be used to create the photomask. Once decomposed, the layers can be subjected to layer treatment and error checks in order to increase the accuracy of the photomask. Once the layers have gone through processing and error checking, the portion of the layout that matches the removed section can be overlaid over the decomposed layers. Once the portions have been added, photomasks can be created using the layout and the portions.

In some embodiments, the boundary areas that were removed can also be decomposed and separate photomasks for the boundary areas can also be created. These photomasks can fill in the gaps that were created when the portions were added to the wafer layout.

Figure 6:
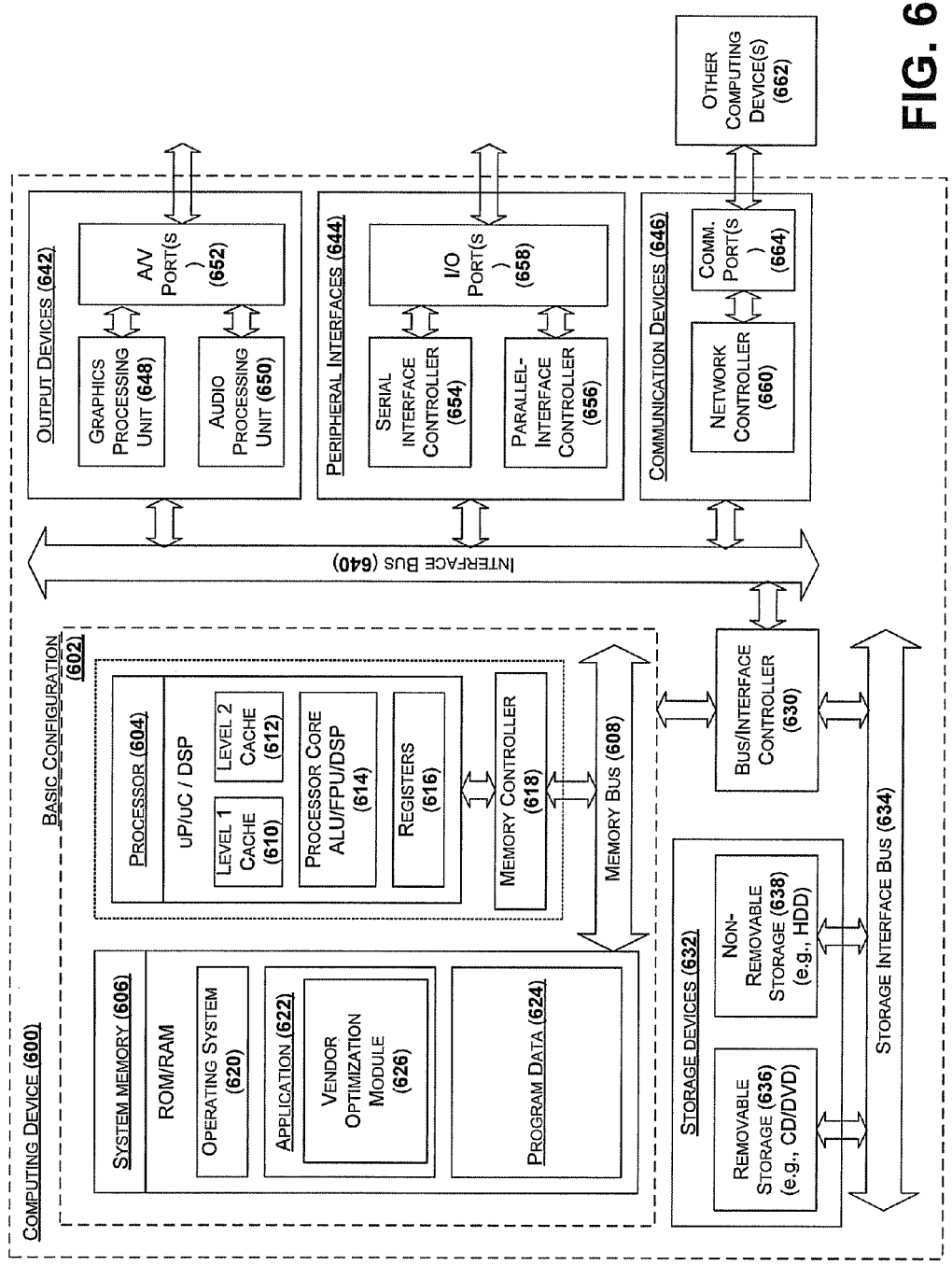
FIG. 6 is a block diagram illustrating an example computing device that is arranged for at least some of the embodiments of the subject disclosure.

FIG. 6 is a block diagram illustrating an example computing device that is arranged for at least some of the embodiments of the subject disclosure. In a very basic configuration 602, computing device 600 typically includes one or more processors 604 and a system memory 606. A memory bus 608 may be used for communicating between processor 604 and system memory 606.

Depending on the desired configuration, processor 604 may be of any type including but not limited to a microprocessor (µP), a microcontroller (µC), a digital signal processor (DSP), or any combination thereof. Processor 604 may include one more levels of caching, such as a level one cache 610 and a level two cache 612, a processor core 614, and registers 616. An example processor core 614 may include an arithmetic logic unit (ALU), a floating point unit (FPU), a digital signal processing core (DSP Core), or any combination thereof. An example memory controller 618 may also be used with processor 604, or in some implementations memory controller 618 may be an internal part of processor 604.

Depending on the desired configuration, system memory 606 may be of any type including but not limited to volatile memory (such as RAM), non-volatile memory (such as ROM, flash memory, etc.) or any combination thereof. System memory 606 may include an operating system 620, one or more applications 622, and program data 624. Application 622 may include a wafer alignment module 626 that is arranged to perform the functions as described herein. Program data 624 may include wafer alignment process and resource information. In some embodiments, application 622 may be arranged to operate with program data 624 on operating system 620.

Computing device 600 may have additional features or functionality, and additional interfaces to facilitate communications between basic configuration 602 and any required devices and interfaces. For example, a bus/interface controller 630 may be used to facilitate communications between basic configuration 602 and one or more data storage devices 632 via a storage interface bus 634. Data storage devices 632 may be removable storage devices 636, non-removable storage devices 638, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 606, removable storage devices 636 and non-removable storage devices 638 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium that may be used to store the desired information and that may be accessed by computing device 600.

Computing device 600 may also include an interface bus 640 for facilitating communication from various interface devices (e.g., output devices 642, peripheral interfaces 644, and communication devices 646) to basic configuration 602 via bus/interface controller 630. Example output devices 642 include a graphics processing unit 648 and an audio processing unit 650, which may be configured to communicate to various external devices such as a display or speakers via one or more A/V ports 652. Example peripheral interfaces 644 include a serial interface controller 654 or a parallel interface controller 656, which may be configured to communicate with external devices such as input devices (e.g., keyboard, mouse, pen, voice input device, touch input device, etc.) or other peripheral devices (e.g., printer, scanner, etc.) via one or more I/O ports 658. An example communication device 646 includes a network controller 660, which may be arranged to facilitate communications with one or more other computing devices 662 over a network communication link via one or more communication ports 664.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 600 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 600 may also be implemented as a controller in an industrial automation environment or as a personal computer.

Other than in the operating examples, or where otherwise indicated, all numbers, values and/or expressions referring to quantities of ingredients, reaction conditions, etc., used in the specification and claims are to be understood as modified in all instances by the term "about."

With respect to any figure or numerical range for a given characteristic, a figure or a parameter from one range may be combined with another figure or a parameter from a different range for the same characteristic to generate a numerical range.

While certain embodiments have been described, these embodiments have been presented by way of example only, and are not intended to limit the scope of the inventions. Indeed, the methods and devices described herein can be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the subject disclosure.

What is claimed is:

1. A system for preparing a set of photomasks, comprising:
   a microprocessor configured to execute instructions from a memory;
   a database that stores portions of layouts in a library, the portions of layouts are decomposed into two or more layers, wherein the portions of layouts are prepared for sidewall image transfer;
   a pattern matching component that receives a layout and analyzes the layout and searches through the portions stored in the database to determine a portion matching a section of the layout;
   an extraction component that removes the section of the layout that matches the portion; and
   a decomposition component that decomposes the layout from which the section has been extracted, and adds the portion to the decomposed layout.

2. The system of claim 1, further comprising a layout treatment component that applies treatment to the portions of layouts in the database.

3. The system of claim 1, further comprising an error checking component that checks for errors in the portions of layouts in the database.

4. The system of claim 1, further comprising a photomask component that adds the portion to the decomposed layout creating a first set of photomasks, wherein the portion replaces the removed section.

5. The system of claim 1, the pattern matching component analyzes metadata associated with the portions and the layout.

6. The system of claim 4, wherein the extraction component removes a boundary area around the section.

7. The system of claim 6, wherein the decomposition component decomposes the removed boundary area and the photomask component creates a second set of photomasks using the boundary area.

8. The system of claim 6, wherein the first set of photomasks has a gap between the portion and the rest of the layout.

9. The system of claim 4, wherein the error checking component checks for errors around the boundary area.

10. A method for creating a photomask by a microprocessor, comprising:

decomposing portions of layouts that are stored in a library, wherein the layouts are decomposed into two or more layers, and the portions of layouts are prepared for sidewall image transfer;

receiving a layout;

analyzing the layout and searches through the portions stored in the database to determine a portion matching a section of the layout;

removing the section of the layout that corresponds to the matching portion; and decomposing the layout from which the section has been extracted, and adding the portion to the decomposed layout.

11. The method of claim 10, further comprising applying layout treatment to the portions of layouts in the library.

12. The method of claim 10, further comprising error checking the portions of layouts in the library.

13. The method of claim 10, further comprising adding the portion to the decomposed layout in place of the removed section and generating a first photomask.

14. The method of claim 10, wherein the analyzing the layout and the portions further comprises examining metadata associated with the layout and the portions.

15. The method of claim 13, further comprising removing a boundary area around the section.

16. The method of claim 15, further comprising generating a second photomask using the removed boundary area.

17. The method of claim 16, further comprising applying the first photomask and the second photomask to create a semiconductor integrated circuit.

18. The method of claim 15, further comprising checking the removed boundary area for errors.

19. The method of claim 13, further comprising checking the first photomask for boundary errors.

20. A non-transitory computer readable storage medium comprising computer executable instructions that, in response to execution, cause a computing system to perform operations, comprising:

decomposing portions of layouts stored in a library, wherein the layouts are decomposed into two or more layers, and the portions of layouts are prepared for sidewall image transfer;

receiving a layout;

analyzing the layout and searches through the portions stored in the database to determine a portion matching a section of the layout;

removing the section of the layout that corresponds to the matching portion; and decomposing the layout from which the section has been extracted, and adding the portion to the decomposed layout, wherein the portion and the layout form a photomask.

* * * * *